United States Patent [19]

Blanchard et al.

[11] Patent Number: 4,968,646
[45] Date of Patent: Nov. 6, 1990

[54] PROCESS FOR FABRICATING SMALL SIZE ELECTRODES IN AN INTEGRATED CIRCUIT

[75] Inventors: Pierre Blanchard, Echirolles; Patrick Baussand, Gieres, both of France

[73] Assignee: Thomson Composants Militaires et Spatiaux, Courbevoie, France

[21] Appl. No.: 448,956

[22] Filed: Dec. 12, 1989

[30] Foreign Application Priority Data

Dec. 20, 1988 [FR] France .................. 88 16805

[51] Int. Cl.$^5$ .................. H01L 21/469; H01L 21/44; H01L 21/48
[52] U.S. Cl. .................. 437/233; 437/189; 437/191; 437/200; 437/41
[58] Field of Search .................. 437/191, 200, 41, 233

[56] References Cited

U.S. PATENT DOCUMENTS

| | | | |
|---|---|---|---|
| 4,727,038 | 2/1988 | Watabe et al. | 437/200 |
| 4,818,715 | 4/1989 | Chao | 437/233 |
| 4,837,180 | 6/1989 | Chao | 437/233 |
| 4,849,069 | 7/1989 | Evans et al. | 437/233 |
| 4,863,879 | 9/1989 | Kwok | 437/41 |

FOREIGN PATENT DOCUMENTS

| | | |
|---|---|---|
| 142186 | 5/1985 | European Pat. Off. . |
| 62-140432 | 6/1987 | Japan .................. 437/233 |

OTHER PUBLICATIONS

Journal of the Electrochemical Society, vol. 130, No. 9, Sep. 1983, pp. 1894-1897, Manchester, N.H., U.S.; R. M. Levin, et al.: "Oxide Isolation for Double-Polysilicon VLSI Devices".

Primary Examiner—Brian E. Hearn
Assistant Examiner—Laura M. Holtzman
Attorney, Agent, or Firm—Oblon, Spivak, McClelland, Maier & Neustadt

[57] ABSTRACT

According to the invention, a first layer of conductive material (11) is submitted to an incomplete etching operation in the presence of a mask (13). After elimination of the mask, a second layer of conductive material is deposited, and the thus-obtained result is submitted to an etching operation without a mask, so allowing the inter-electrode gaps to be reduced.

The process provides a very tight electrode configuration, and is particularly suited to charge-coupled devices.

7 Claims, 1 Drawing Sheet

PROCESS FOR FABRICATING SMALL SIZE ELECTRODES IN AN INTEGRATED CIRCUIT

BACKGROUND OF THE INVENTION

1. Field of the Invention:

The present invention relates to a process for the manufacture of electrodes in an integrated circuit, and more particularly to the formation of such electrodes in a charge coupled device.

The invention makes it possible to obtain electrodes or gates that are separated by the smallest feasible distance.

2. Description of the Prior Art:

With charge coupled devices (CCDs), it is common practice to define the electrodes in polycrystalline silicon (polysilicon) layers. After one such layer has been deposited on an insulating substrate, an etching operation is carried out through a pattern mask defining the electrode configuration. A constant problem in implementing this technique is to obtain a configuration having the required dimensions. In the present state of the art, it can be considered that while the dimensions are respected in the photolithography defining the pattern mask, there occurs a lateral retraction during etching. The extent of this retraction varies with the etching method used. In this respect, a distinction can be drawn between isotrophic etching, in which the removal of silicon occurs in the same manner in all directions, and anisotropic etching, in which it is possible to confer directional properties to the etching away of silicon by enhancing the action in the depth of the layer. But whichever the method used, lateral retraction remains inevitable. This problem is compounded by the fact that present circuits call for a growing number of electrode levels, leading to increasingly complex mask patterns for the different layers, unavoidable increases in etching periods, and consequently to a certain amount of over-etching of some layers, with relatively large shrinkages. To a certain extent, it is possible to compensate in advance for an over-etching by playing on the mask pattern. However, this kind of compensation is limited by the resolution of the photolithographic process and ceases to be applicable when dealing with very tight configurations, especially those of a periodic nature.

The present invention solves this problem and provides for very closely configured electrodes, in particular where inter-electrode spacings can be smaller than that obtainable with photolithographic resolution.

SUMMARY OF THE INVENTION

To that end, the present invention essentially relates to a process for the manufacture of electrodes in an integrated circuit, wherein said process essentially comprises the steps of: depositing a first layer of conductive material, depositing a mask over said first layer to define an electrode configuration, submitting said layer covered by said mask to an etching operation, interrupting said etching operation before said electrodes become individually defined, —eliminating said mask, depositing a second layer of conductive material over said first, incompletely etched, layer and, submitting the thus obtained product to a new etching operation, in the absence of a mask, until said electrodes become individually defined.

The present invention is therefore remarkable in that it implements a double deposition and a double etching operation while using just a single mask. It is particularly well suited to the fabrication of "storage electrodes" in a charge-coupled device, where it desirable to reduce the width of the inter-electrode spacings as much as possible. The two etching operations are preferably carried out in the anisotropic mode.

BRIEF DESCRIPTION OF THE DRAWINGS

The present invention shall be more clearly understood, and its advantages shall become more apparent upon reading the following description of a process according to its teachings by way a number of embodiments thereof, given merely as an example and explained with reference to the appended drawings in which.

DESCRIPTION OF THE PREFERRED EMBODIMENTS

Figure 1:
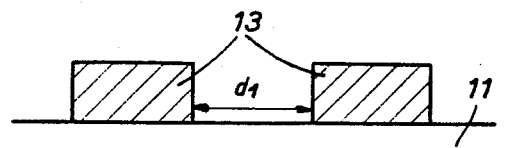
FIGS. 1 to 4 illustrate the principal steps of the electrode forming process according the invention.

In FIGS. 1 to 4, there is more specifically shown the steps involved in the formation of storage electrodes for a CCD. As is common practice, these electrodes, or gates, are made of polycrystalline silicon. A first polycrystalline layer 11 is first of all deposited on an insulating substrate 12. A mask 13 is then placed over the layer 11. This situation is illustrated in FIG. 1. It should be noted that the layers or masks are implemented by standard procedures, which shall not be described here in detail. The same applies for etching or removal of these layers, as well as for the elimination of the mask. Referring to FIG. 1, it can be assumed, if needs be, that the space $d_1$ left between the two parts of the mask to protect the electrodes that are about to be made is made as small as the photolithographic process used for creating the mask will allow.

Figure 2:
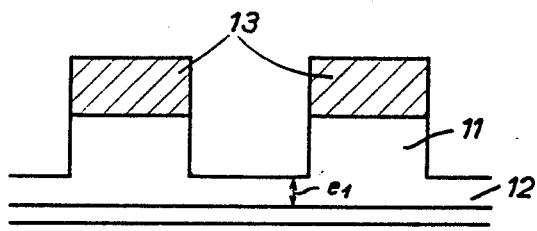
Figure 3:
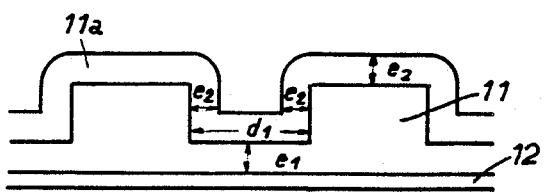
Figure 4:
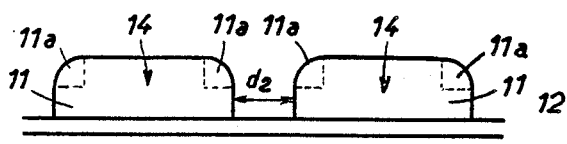

According to an important feature of the invention, there is then performed an etching away, which is here anisotropic, but the etching is not taken to the end of its course, i.e. up to the individualisation of the electrodes. In other words, a certain amount of thickness $e_1$ of the silicon layer 11 is allowed to remain at the bottom of the inter-electrode spaces about to be produced, the substrate 12 not being formed at that stage in the process. This situation is illustrated in FIG. 2. It is recalled here that the depth of the etching is controlled by acting on the period during which the polycrystalline silicon layer is submitted to etching process. The mask is then eliminated and a second polycrystalline silicon layer 11a, of thickness $e_2$, which is deposited over the first, incompletely etched, layer. The result is the structure illustrated in FIG. 3, where it can be seen that the inter-electrode spacing, which was formerly $d_1$ in the previous etching step, is reduced by approximately twice the thickness $e_2$ of layer 11a. The thickness of the silion at the locations of the future inter-electrode spaces increases to become $e_1+e_2$. There is then performed a second etching step that is conducted without a mask, and which is also anisotropic. This time, the etching is continued until electrodes are individualised. In other words, the etching is continued until a thickness $e_1+e_2$ has disappeared, whereby the insulating substrate at the bottom of the inter-electrode spaces is cleared, hence separating the latter. The electrodes are shown to appear in FIG. 4. In this case, however, the inter-electrode spacing $d_2$ remains smaller than would have been possible to achieve with the photolithography shown in FIG. 1. In FIG. 4, which depicts the structure obtained at the end of the process, it can be seen that the second layer 11a has almost totally disppeared except at the edges of the electrodes, the final inter-electrode spacing $e_2$ being smaller than the spacing $e_1$ that was defined by the mask.

Figure 5:
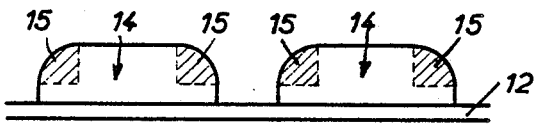
FIG. 5 is a similar view to FIG. 4 illustrating an alternative embodiment.

In the above-described example, the two layers 11 and 11a are made of the same conductive material, which was in this case polycrystalline silicon. But there can also be envisaged alternative embodiments using different conductive materials. In particular, if the first layer is made of polyscrystalline silicon, the second layer can be made of a material capable of combining with the polycrystalline silicon to form a low-resistivity silicide. More specifically, the second material can be a so-called "refractory" metal such as tantalum or titanium. The low-resistivity silicide is in this case obtained by a thermal process known in the art, and can be carried out after deposition of the second layer. The end result is as shown in FIG. 5, and analogous to the state shown in FIG. 4, except that the lateral zones 15 are in this case made of highly conductive silicide, and not polycrystalline silicon, as in the previous example. The heat treatment can take place immediately after the step shown in FIG. 3, or after the second etching operation, i.e. on a structure analogous that of FIG. 4. This embodiment has the advantage of substantially reducing the electrode access resistance. The embodiment remains applicable for the fabrication of optical CCDs. Indeed, the transparency is conserved over a major part of the electrode width, since the electrode is still made of polycrystalline silicon. The opaque portions made of silicide are in any case located at inter-electrode overlap zones, which are already zones of "disrupted" topology, so lilmiting the drawback of their opacity.

Figure 6:
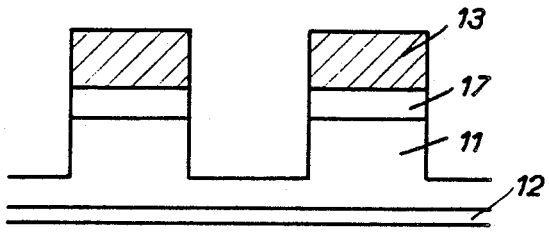
FIGS. 6 and 7 illustrate specific steps in another embodiment.
Figure 7:
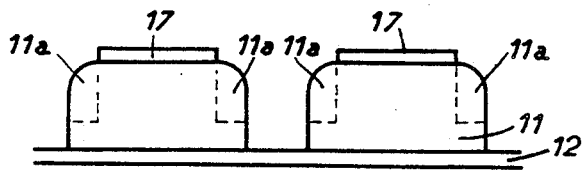

FIGS. 6 and 7 depict modified steps of an alternative embodiment; these correspond to FIGS. 2 and 4 respectively. This embodiment allows the thickness of the first layer to be maintained. Here, a first protective layer 17 is deposited on the first semiconductor material layer 11 before deposition of the mask 13. For the first etching step, with the mask present, the etching conditions and-/or the etching agent is/are adapted to successively remove first those parts of the protective layer not covered by the mask, and then the polycrystalline silicon located at the future inter-electrode spaces. In the second anisotropic etching, the upper part of the electrode is protected by those parts of the protective layer that were located beneath the mask. The protective layer 17 can be made of silicon oxide. There is then obtained the structure depicted in FIG. 7, in which the upper electrode surfaces are covered by the remains of the protective layer.

What is claimed is:

1. A process for the manufacture of electrodes in an integrated circuit, wherein said process essentially comprises the steps of:

depositing a first layer of conductive material, depositing a mask over said first layer to define an electrode configuration, submitting said layer covered by said mask to an etching operation, interrupting said etching operation before said electrodes become individually defined, eliminating said mask, depositing a second layer of conductive material over said first, incompletely etched, layer and, submitting the thus obtained product to a new etching operation, in the absence of a mask, until said electrodes become individually defined.

2. The process as claimed in claim 1, wherein said first and said second layers of conductive material are made of a same conductive material.

3. The process as claimed in claim 1, wherein said first and said second layers are made of different conductive materials.

4. The process as claimed in claim 3, wherein said first layer is made of polycrystallilne silicon and said second layer is made of a material apt to combine with said polycrystalline silicon to form a low resistivity silicide.

5. The process as claimed in claim 4, wherein there is further comprised a heat treatment step after depositing said second layer, to create said silicide.

6. The process as claimed in claim 1, wherein a protective layer is deposited on said first layer of conductive material, prior to depositing said mask.

7. The process as claimed in claim 2, wherein said same conductive material is polycrystalline silicon.

* * * * *